(12) United States Patent
Oppermann et al.

(10) Patent No.: US 12,327,751 B2
(45) Date of Patent: Jun. 10, 2025

(54) MASSIVE PARALLEL ASSEMBLY METHOD

(71) Applicants: HUAWEI TECHNOLOGIES DUESSELDORF GMBH, Duesseldorf (DE); FRAUNHOFER-GESELLSCHAFT ZUR FÖRDERUNG DER ANGEWANDTEN FORSCHUNG E.V., Munich (DE)

(72) Inventors: Hans-Hermann Oppermann, Berlin (DE); Kai Zoschke, Berlin (DE); Charles-Alix Manier, Berlin (DE)

(73) Assignees: Fraunhofer-Gesellschaft zur Förderung der angewandten Forschung e.V., Munich (DE); Huawei Technologies Duesseldorf GmbH, Duesseldorf (DE)

(*) Notice: Subject to any disclaimer, the term of this patent is extended or adjusted under 35 U.S.C. 154(b) by 377 days.

(21) Appl. No.: 17/842,430

(22) Filed: Jun. 16, 2022

(65) Prior Publication Data

US 2022/0319902 A1  Oct. 6, 2022

Related U.S. Application Data

(63) Continuation of application No. PCT/EP2020/086335, filed on Dec. 16, 2020.

(30) Foreign Application Priority Data

Dec. 16, 2019  (EP) .................................... 19216475

(51) Int. Cl.
*H01L 21/683* (2006.01)
*H01L 23/00* (2006.01)
*H10H 20/01* (2025.01)

(52) U.S. Cl.
CPC .......... *H01L 21/6836* (2013.01); *H01L 24/95* (2013.01); *H10H 20/018* (2025.01);
(Continued)

(58) Field of Classification Search
CPC . H01L 21/6836; H01L 24/95; H01L 33/0093; H01L 2221/68354;
(Continued)

(56) References Cited

U.S. PATENT DOCUMENTS 7,169,652 B2 * 1/2007 Kimura .................. H01L 24/81
438/455
8,349,116 B1 * 1/2013 Bibl ........................ B32B 38/18
156/273.1

(Continued)

FOREIGN PATENT DOCUMENTS

CN 107210293 A 9/2017
DE 102014201635 B3 5/2015
(Continued)

*Primary Examiner* — Vu A Vu
(74) *Attorney, Agent, or Firm* — Leydig, Voit & Mayer, Ltd.

(57) ABSTRACT

A method for manufacturing a device is provided. The method comprises providing a first carrier having attached thereto a plurality of chips by means of an adhesive layer of the first carrier, a first surface of the plurality of chips being attached to the first carrier. Further, the method comprises selectively attaching a second surface of a subset of the plurality of chips to a conveyor carrier by means of a structured adhesive layer of the conveyor layer. Further, the method comprises selectively releasing the subset of the plurality of chips from the first carrier by means of debonding corresponding sections of the adhesive layer of the first carrier. Further, the method comprises attaching the first surface of the subset of the plurality of chips to a substrate of the device.

20 Claims, 11 Drawing Sheets

(52) U.S. Cl.
CPC .............. *H01L 2221/68354* (2013.01); *H01L 2221/68368* (2013.01); *H01L 2221/68381* (2013.01); *H01L 2224/95136* (2013.01)

(58) Field of Classification Search
CPC . H01L 2221/68368; H01L 2221/68381; H01L 2224/95136; H01L 24/83; H01L 25/0753; H01L 2224/29144; H01L 2221/68322; H01L 2224/04026; H01L 2224/05644; H01L 2224/83815; H01L 2224/95; H01L 21/6835; H01L 27/156; H01L 24/98; H01L 33/486; H01L 33/62; H01L 2933/0033; H01L 2933/0066

USPC .......................................................... 438/455
See application file for complete search history.

(56) References Cited

U.S. PATENT DOCUMENTS

| | | | | |
|---|---|---|---|---|
| 9,941,262 | B2* | 4/2018 | Thompson | H01L 33/486 |
| 10,096,740 | B1* | 10/2018 | Chen | H01L 33/36 |
| 10,714,464 | B2* | 7/2020 | Pokhriyal | H01L 25/50 |
| 10,984,708 | B1* | 4/2021 | Pourchet | G06F 9/3004 |
| 10,985,046 | B2* | 4/2021 | Paranjpe | H01L 33/0095 |
| 11,342,213 | B2* | 5/2022 | Chang | H01L 33/62 |
| 11,658,262 | B1* | 5/2023 | Cheng | H01L 25/0753 |
| | | | | 438/22 |
| 2005/0087743 | A1 | 4/2005 | Ogihara et al. | |
| 2008/0122119 | A1 | 5/2008 | Kian et al. | |
| 2017/0358623 | A1* | 12/2017 | Thothadri | H01L 21/6835 |
| 2018/0219005 | A1 | 8/2018 | Bedell et al. | |
| 2020/0075560 | A1* | 3/2020 | Zou | H01L 33/0093 |
| 2021/0013367 | A1* | 1/2021 | Wu | H01L 33/32 |
| 2022/0293825 | A1* | 9/2022 | Maruyama | H01S 5/022 |

FOREIGN PATENT DOCUMENTS

| | | |
|---|---|---|
| JP | 2002314052 A | 10/2002 |
| JP | 2005150703 A | 6/2005 |

* cited by examiner

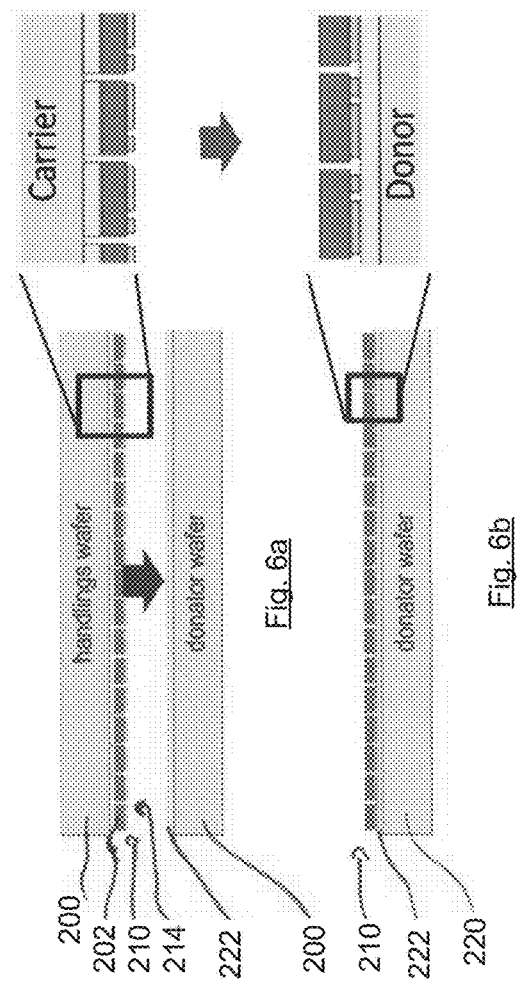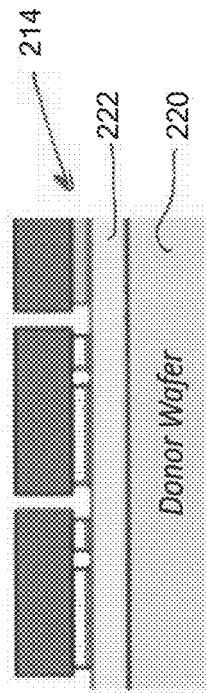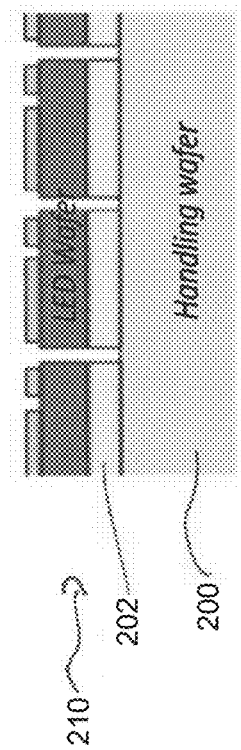

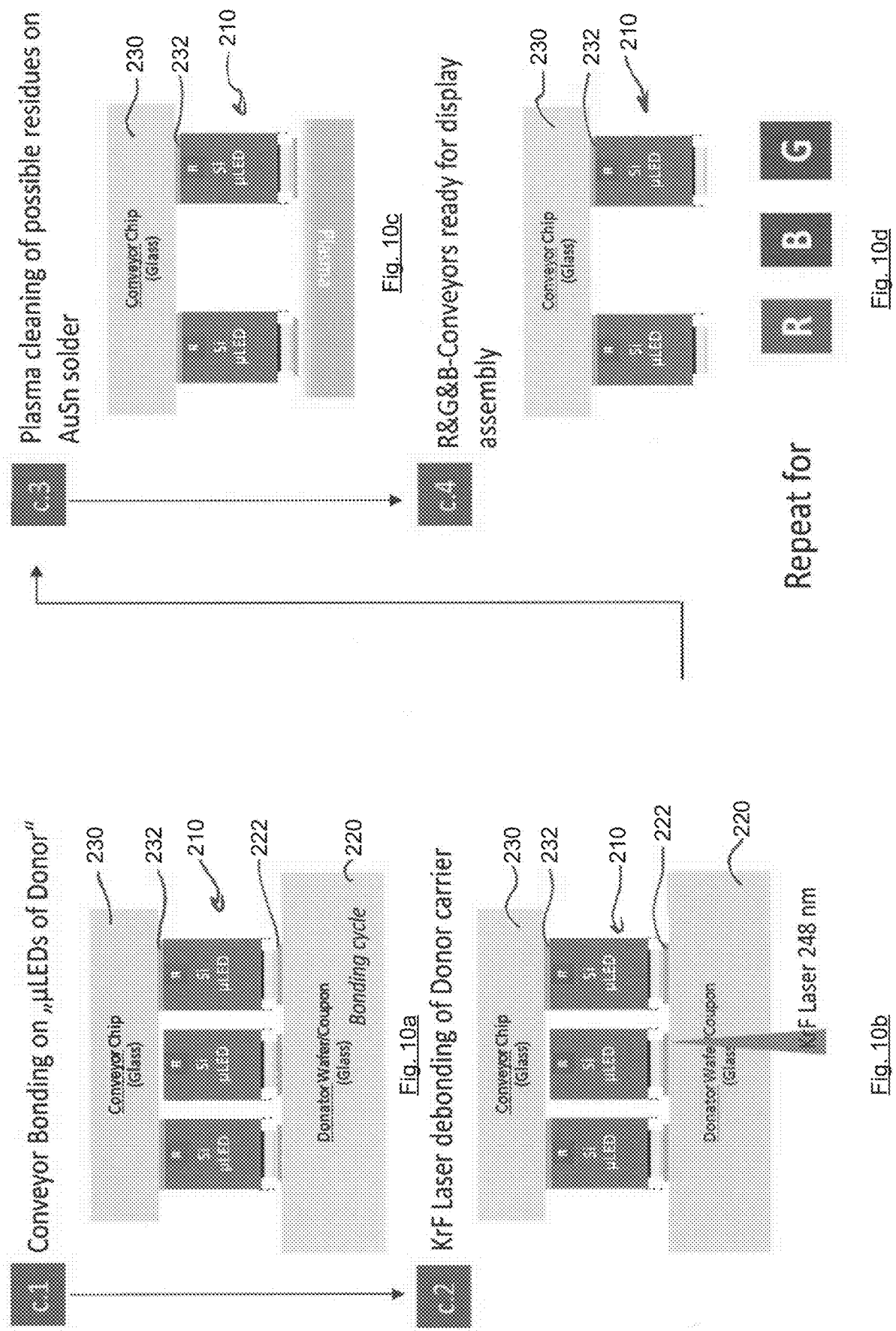

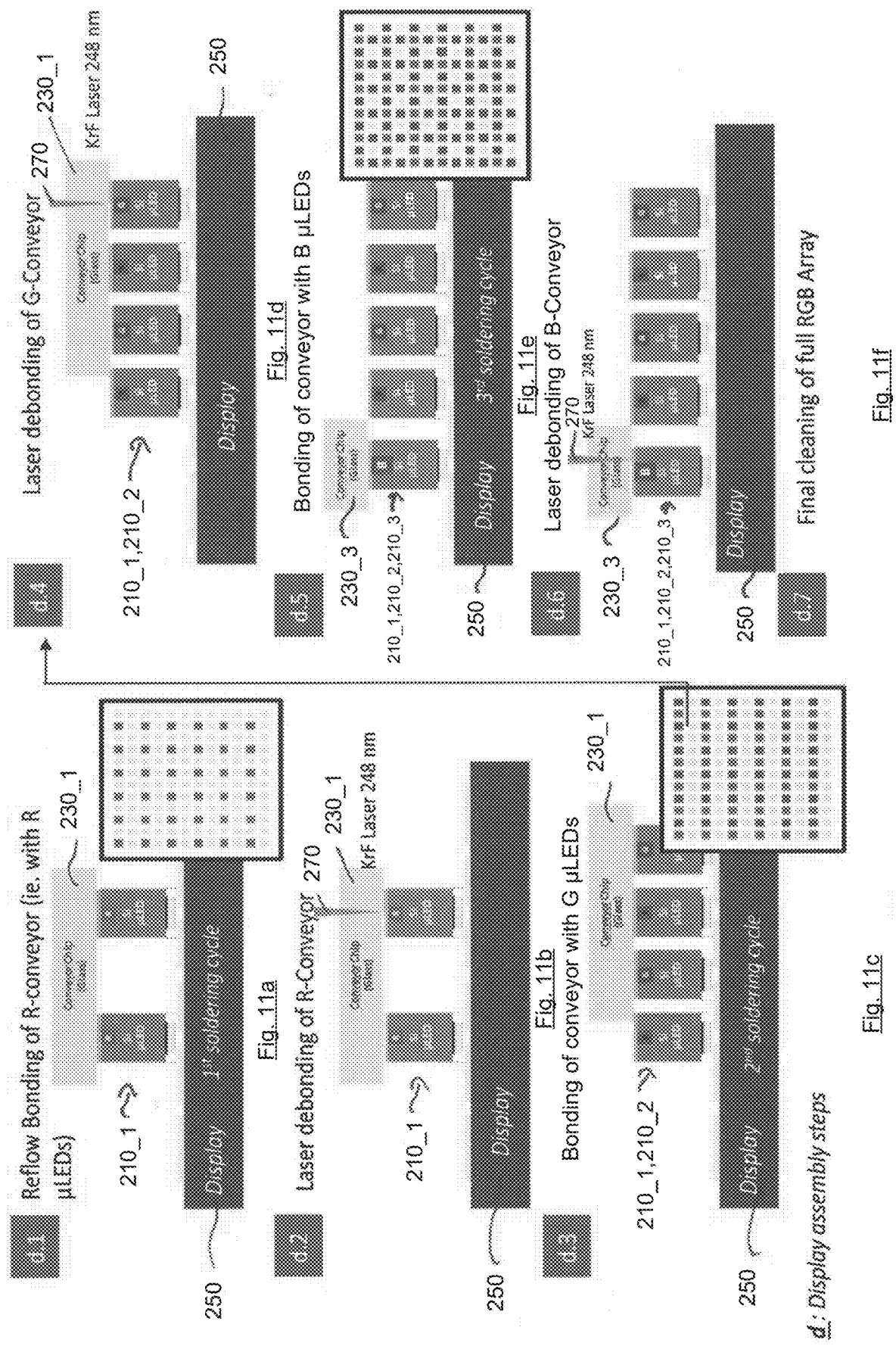

MASSIVE PARALLEL ASSEMBLY METHOD

CROSS-REFERENCE TO RELATED APPLICATIONS

This application is a continuation of International Application No. PCT/EP2020/086335, filed on Dec. 16, 2020, which claims priority to European Patent (EP) Application No. EP19216475.4, filed on Dec. 16, 2019. The disclosures of the aforementioned applications are hereby incorporated by reference in their entireties.

TECHNICAL FIELD

Embodiments relate to a method for manufacturing a device, and specifically, to a method that allows to attach in parallel a plurality of chips to a substrate. Some embodiments relate to a massive parallel assembly.

BACKGROUND

Usually, for bonding chips on a substrate, the chips are cut out individually by means of a needle from a sawn wafer with an adhesive film, received in a vacuum tool, aligned with respect to the substrate in an accurate position and connected, for example, in a thermal step, by means of adhering, soldering or pressure welding or friction welding. If the chip size becomes very small, e.g., below 250 µm edge length, handling during cutting and receiving becomes difficult. With a plurality of chips to be bonded (e.g., several 1000 chips), it becomes increasingly uneconomical, since the entire loading time for a substrate increases.

According to Market and Technology Report-MicroLED Displays, 2017, reported by Yole Dévelopement, different methods are known for realizing parallel assembly of equal members, which are usable to a limited extent.

Therefore, it is the object of the present invention to improve the current situation.

SUMMARY

This object is solved by the independent claims.

Advantageous implementations are addressed in the dependent claims.

Embodiments provide a method for manufacturing a device. The method comprises providing a first carrier (e.g., a glass carrier/glass wafer) having attached thereto a plurality of chips (e.g., µLEDs) by means of an adhesive layer of the first carrier (e.g., disposed on, for example, a surface of the carrier), a first surface of the plurality of chips being attached to the first carrier. Further, the method comprises selectively attaching a second surface (e.g., opposite to the first surface) of a subset (e.g. proper subset) of the plurality of chips to a conveyor carrier (e.g., a glass carrier/glass wafer) by means of a structured adhesive layer of the conveyor layer (e.g., disposed on, for example, a surface of the conveyor carrier). Further, the method comprises selectively releasing the subset (e.g. proper subset) of the plurality of chips from the first carrier by means of debonding (e.g., laser debonding) corresponding sections of the adhesive layer of the first carrier (e.g., sections of the adhesive layer of the first carrier to which the subset (e.g., proper subset) of the plurality of chips are attached) (e.g., and cleaning the first surface of the subset of the plurality of chips). Further, the method comprises attaching the first surface of the subset (e.g. proper subset) of the plurality of chips to a substrate of the device. Further, the method comprises releasing the subset (e.g., proper subset) of the plurality of chips from the conveyor carrier by means of debonding (e.g., laser debonding) at least corresponding sections of the structured adhesive layer of the conveyor carrier (e.g., sections of the adhesive layer of the conveyor layer to which the proper subset of the plurality of chips are attached). Thereby, at least one out of selectively releasing the proper subset of the plurality of chips from the first carrier and releasing the proper subset of the plurality of chips from the conveyor carrier is performed by means of laser debonding.

Embodiments allow for a parallel high-precision assembly.

In embodiments, the plurality of chips are a two-dimensional array of chips.

In embodiments, the subset (e.g., proper subset) of the plurality of chips is defined by a two-dimensional pattern.

In embodiments, according to the two-dimensional pattern at least every 2nd or 3rd chip in a row direction and/or at least every 2nd or 3rd chip in a column direction is selected out of the two-dimensional array of chips, to obtain the subset (e.g., proper subset) of chips.

In embodiments, the method further comprises providing the conveyor carrier with an adhesive layer disposed thereon, and a structuring the adhesive layer of the conveyor carrier based on the two-dimensional pattern defining the subset (e.g., proper subset) of the chips, to obtain the structured adhesive laser of the conveyor layer.

In embodiments, attaching the first surface of the subset (e.g., proper subset) of the plurality of chips to the substrate of the device comprises bonding the subset of the plurality of chips to the substrate of the device.

In embodiments, the first surface of plurality of chips comprises a metallization layer.

In embodiments, the first surface of the subset (e.g., proper subset) of the plurality of chips comprises a metallization layer having disposed thereon an AuSn solder layer stack, wherein attaching the first surface of the subset (e.g., proper subset) of the plurality of chips to the substrate of the device comprises soldering the subset (e.g., proper subset) of the plurality of chips to the substrate of the device at a temperature of at least 280° C. (e.g., a temperature between 280° C. and 350° C., or a temperature between 280° C. and 500° C.).

In embodiments, the first carrier is a handling carrier.

In embodiments, the first carrier is a donor carrier, wherein providing the donor carrier comprises: providing a handling carrier (e.g., a glass carrier/glass wafer) having attached thereto the plurality of chips by means of an adhesive layer of the handling carrier (e.g., disposed on, for example, a surface of the handling carrier), the second surface of the plurality of chips being attached to the handling carrier; attaching the first surface of the plurality of chips or a proper subset of the plurality of chips to the donor carrier by means of the adhesive layer of the donor carrier; and releasing the plurality of chips or the proper subset of the chips from the handling carrier by means of laser debonding at least corresponding sections of the adhesive layer of the handling carrier.

In embodiments, providing the donor carrier further comprises providing a metallization layer on the first surface of the devices prior to attaching the first surface of the plurality of chips to the donor carrier.

In embodiments, providing the donor carrier further comprises providing a metallization layer on the first surface of the devices prior to attaching the first surface of the plurality of chips to the donor carrier and providing an AuSn solder layer stack on the metallization layer.

In embodiments, providing the donor carrier further comprises providing an AuSn solder layer stack on a metallization layer of the plurality of chips (e.g., a metallization layer that is disposed on a first surface of the plurality of chips).

For example, an Au/Sn stack (e.g., Au/Sn metal stack) can be provided (e.g., disposed on the metallization layer) and annealed. The eutectic solder AuSn20 or Au/Sn 80/20 is formed at a soldering temperature of at least 280° C. When re-melting/soldering, excessive gold alloys with Au/Sn 80/20 (eutectic) and converts to Au/Sn 88/12 (Au5Sn or zeta phase), which only melts at 512° C.

In embodiments, providing the handling carrier comprises: providing a (e.g., semi conductor) substrate having formed thereon the plurality of chips; attaching the substrate with the plurality of chips to the handling carrier by means of an adhesive layer (e.g., disposed on, for example, a surface of the carrier), the plurality of chips facing the carrier; and separating the plurality of chips from the substrate (e.g., by means of dicing the substrate).

In embodiments, the plurality of chips is a first plurality of chips (e.g., µLEDs of a first color), wherein the method further comprises: providing a second carrier (e.g., a glass carrier/glass wafer) having attached thereto a second plurality of chips (e.g., µLEDs of a second color, different from the first color) by means of an adhesive layer of the second carrier (e.g., disposed on, for example, a surface of the carrier), a first surface of the second plurality of chips being attached to the second carrier; selectively attaching a second surface (e.g., opposite to the first surface) of a subset (e.g., proper subset) of the second plurality of chips to a second conveyor carrier (e.g., a glass carrier/glass wafer) by means of a structured adhesive layer of the second conveyor layer (e.g., disposed on, for example, a surface of the conveyor carrier); selectively releasing the subset (e.g., proper subset) of the second plurality of chips from the second carrier by means of laser debonding corresponding sections of the adhesive layer of the second carrier (e.g., sections of the adhesive layer of the second carrier to which the subset, for example, a proper subset, of the second plurality of chips are attached); attaching the first surface of the subset (e.g., proper subset) of the second plurality of chips to the substrate of the device; and releasing the subset (e.g., proper subset) of the second plurality of chips from the second conveyor carrier by means of laser debonding at least corresponding sections of the structured adhesive layer of the second conveyor carrier (e.g., sections of the adhesive layer of the second conveyor layer to which the subset (e.g., proper subset) of the second plurality of chips are attached).

In embodiments, the subset (e.g., proper subset) of the first plurality of chips and the subset (e.g., proper subset) of the second plurality of chips are arranged in an interleaved manner with respect to each other on the substrate of the device.

In embodiments, the first surface of the subset (e.g., proper subset) of the first plurality of chips and the first surface of the subset (e.g., proper subset) of the second plurality of chips comprises a metallization layer having disposed thereon an AuSn solder layer stack, wherein attaching the first surface of the subset (e.g., proper subset) of the first plurality of chips to the substrate of the device comprises soldering the first subset (e.g., proper subset) of the first plurality of chips to the substrate of the device at a temperature between 280° and 350° C., and wherein attaching the first surface of the subset (e.g., proper subset) of the second plurality of chips to the substrate of the device comprises soldering the second subset (e.g. proper subset) of the first plurality of chips to the substrate of the device at a temperature between 280° and 350° C., wherein the first plurality of chips are soldered to the substrate of the device prior to attaching the first surface of the subset (e.g., proper subset) of the second plurality of chips to the substrate of the device.

In embodiments, the chips are at least one out of semiconductor chips, optical filters, ferromagnets, high-K dielectrics, tilting mirrors, micro lenses, laser diodes, photodetectors and light emitting diodes (e.g., mini or micro light emitting diodes).

In embodiments, the device is a display or a part of a display.

In embodiments, the device is an optical module or part of an optical module (e.g., optical transceiver, for example, for laser diodes, photodetectors, mirrors or optical filters).

In embodiments, the device is a power regulator or switches (e.g., for capacitors with high-K dielectrics or for inductors with ferrites or ferromagnets).

BRIEF DESCRIPTION OF DRAWINGS

Embodiments of the present invention are described herein making reference to the appended drawings.

FIG. 6a shows a cross-sectional view of an intermediate product of the manufacturing of the device during a step of attaching the first surface of the plurality of chips or a proper subset of the plurality of chips to a donor carrier by means of an adhesive layer of the donor carrier;

FIG. 6b shows a cross sectional view of an intermediate product of the manufacturing of the device after a step of releasing the plurality of chips or the proper subset of the plurality of chips from the handling carrier;

FIG. 6c shows a cross-sectional view of an intermediate product of the manufacturing of the device after a step of providing a handling carrier having attached thereto a plurality of chips by means of an adhesive layer;

FIG. 6d shows a cross sectional view of an intermediate product of the manufacturing of the device after a step of flipping the plurality of chips or the proper subset of the plurality of chips by means of the donor carrier and removing the handling carrier from the plurality of chips or the proper subset of the plurality of chips;

FIG. 10a shows a cross sectional view of an intermediate product of the manufacturing of the device after the step of selectively attaching a subset (e.g. proper subset) of the plurality of chips to a conveyor carrier by means of a structured adhesive layer;

FIG. 10b shows a cross sectional view of an intermediate product of the manufacturing of the device during the step of selectively releasing the subset (e.g. proper subset) of the plurality of chips from the donor carrier (or handling carrier) by means of laser debonding;

FIG. 10c shows a cross sectional view of an intermediate product of the manufacturing of the device after the step of selectively releasing the subset (e.g. proper subset) of the plurality of chips from the donor carrier (or handling carrier) and cleansing the subset (e.g. proper subset) of the plurality of chips by means of a plasma;

FIG. 10d shows a cross sectional view of an intermediate product of the manufacturing of the device after cleansing the subset (e.g. proper subset) of the plurality of chips that are attached to the conveyor carrier by means of a plasma;

FIG. 11a shows a cross sectional view of an intermediate product of the manufacturing of the device after the step of attaching a subset (e.g. proper subset) of the first plurality of chips (e.g., μLEDs of a first color (e.g., red)) to the substrate of the device using a first conveyor carrier;

FIG. 11b shows a cross sectional view of an intermediate product of the manufacturing of the device during the step of releasing the subset (e.g. proper subset) of the first plurality of chips from the first conveyor carrier, e.g. by means of laser debonding;

FIG. 11c shows a cross sectional view of an intermediate product of the manufacturing of the device after the step of attaching a subset (e.g. proper subset) of a second plurality of chips (e.g., μLEDs of a second color (e.g., green)) to the substrate of the device using a second conveyor carrier;

FIG. 11d shows a cross sectional view of an intermediate product of the manufacturing of the device during the step of releasing the subset (e.g. proper subset) of the second plurality of chips from the second conveyor carrier, e.g., by means of laser debonding;

FIG. 11e shows a cross sectional view of an intermediate product of the manufacturing of the device after the step of attaching a subset (e.g. proper subset) of a third plurality of chips (e.g., μLEDs of a third color (e.g., blue)) to the substrate of the device using a third conveyor carrier; and FIG. 11f shows a cross sectional view of an intermediate product of the manufacturing of the device during the step of releasing the subset (e.g. proper subset) of the third plurality of chips from the third conveyor carrier, e.g., by means of laser debonding.

DESCRIPTION OF EMBODIMENTS

Figure 1:
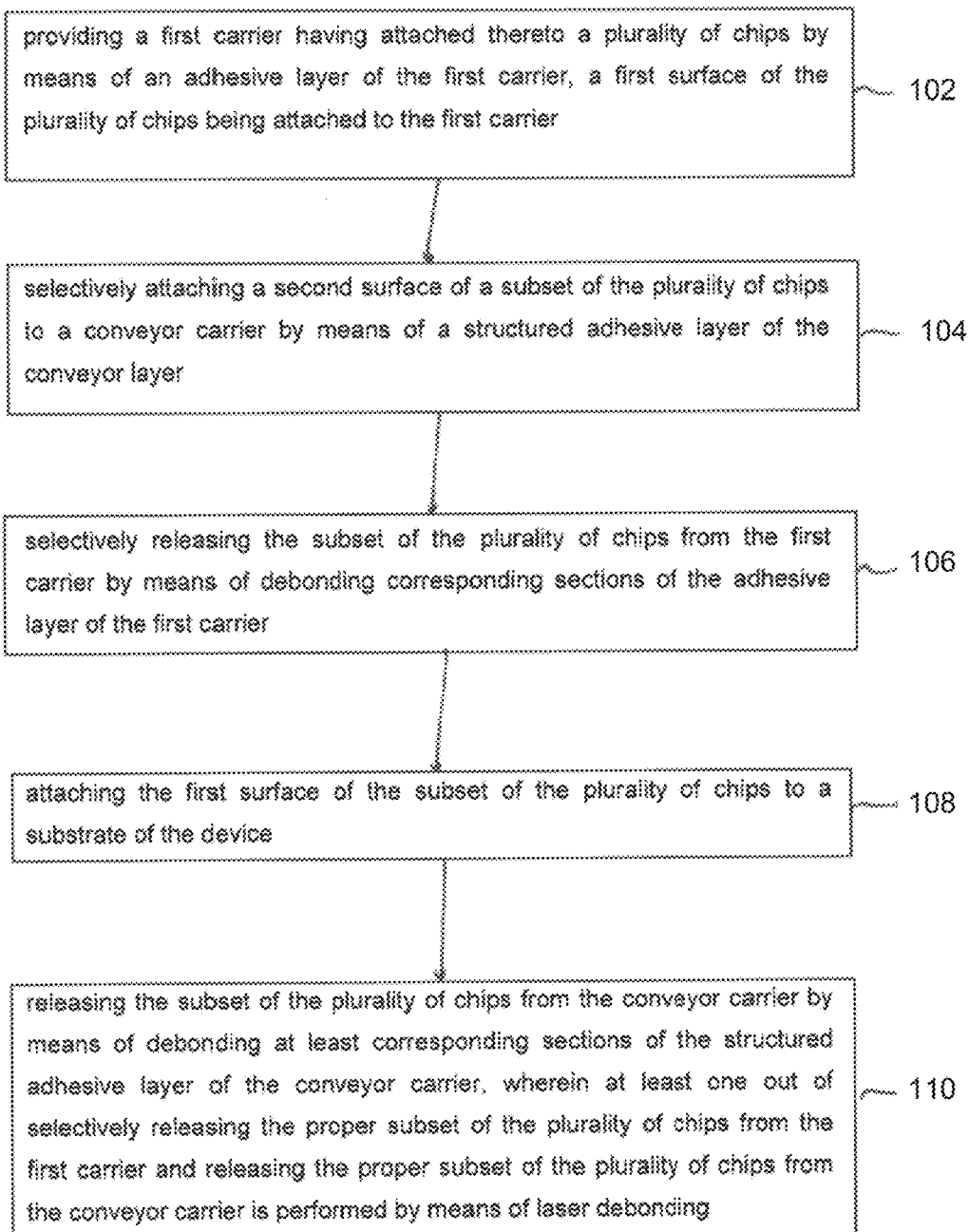
FIG. 1 shows a flow chart of a method for manufacturing a device, according to an embodiment of the present invention.

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

FIG. 1 shows a flow chart of a method 100 for manufacturing a device, according to an embodiment of the present invention. The method 100 comprises a step 102 of providing a first carrier having attached thereto a plurality of chips by means of an adhesive layer of the first carrier, a first surface of the plurality of chips being attached to the first carrier. Further, the method 100 comprises a step 104 of selectively attaching a second surface of a subset of the plurality of chips to a conveyor carrier by means of a structured adhesive layer of the conveyor layer. Further, the method 100 comprises a step 106 of selectively releasing the subset of the plurality of chips from the first carrier by means of debonding corresponding sections of the adhesive layer of the first carrier. Further, the method 100 comprises a step 108 of attaching the first surface of the subset of the plurality of chips to a substrate of the device. Further, the method 100 comprises a step 110 of releasing the subset of the plurality of chips from the conveyor carrier by means of debonding at least corresponding sections of the structured adhesive layer of the conveyor carrier. Thereby, at least one out of selectively releasing the proper subset of the plurality of chips from the first carrier and releasing the proper subset of the plurality of chips from the conveyor carrier is performed by means of laser debonding.

Subsequently, embodiments of the method 100 for manufacturing a device are described in further detail referring to FIGS. 2a to 2f, which show cross-sectional views of the device or of intermediate (or interstage) products of the manufacturing of the device obtained after different steps of the method 100 for manufacturing the device.

Figure 2:
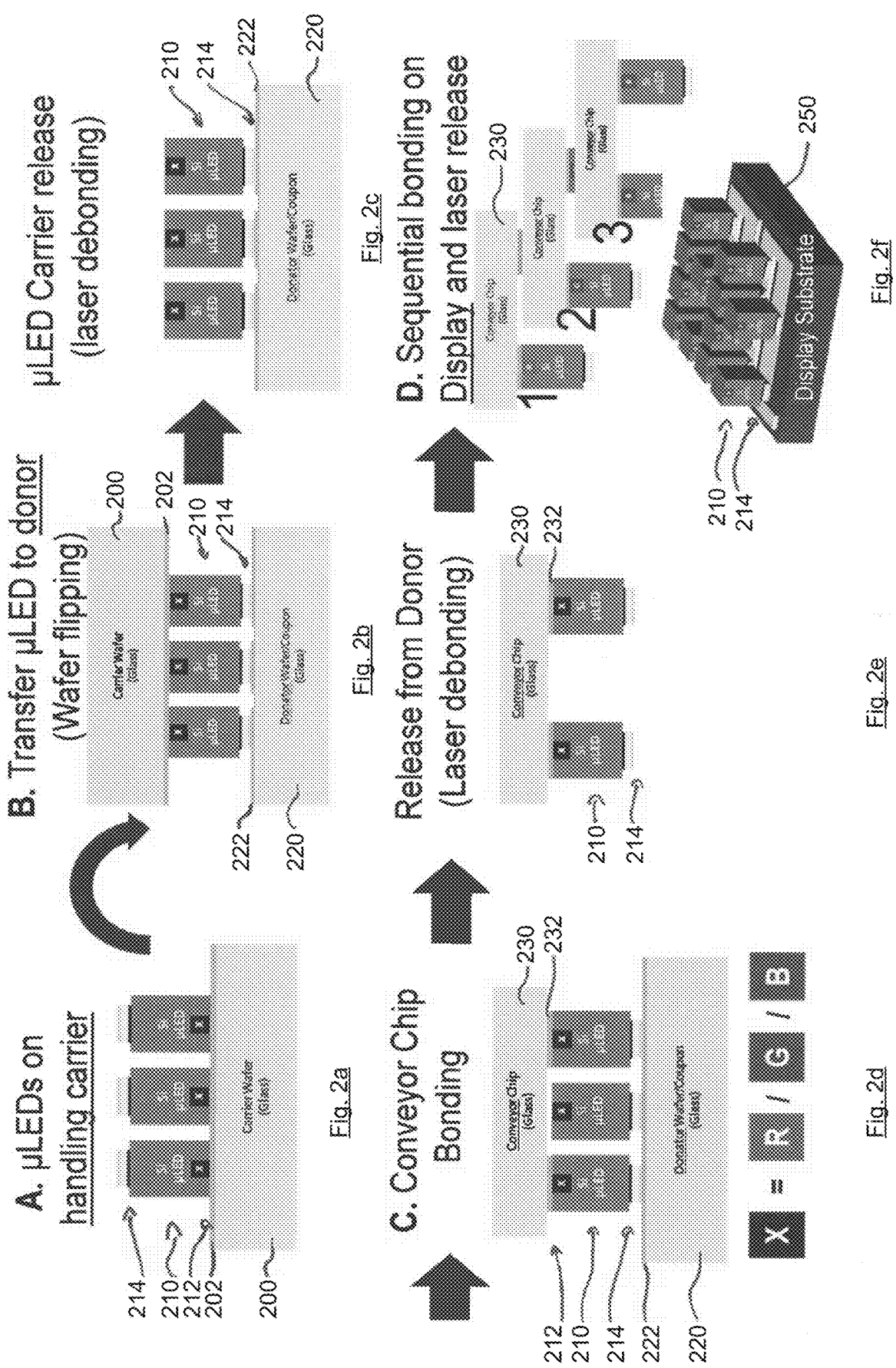
FIG. 2a shows a cross-sectional view of an intermediate product of the manufacturing of the device after a step of providing a handling carrier having attached thereto a plurality of chips by means of an adhesive layer.
FIG. 2b shows a cross sectional view of an intermediate product of the manufacturing of the device after a step of attaching the first surface of the plurality of chips or a proper subset of the plurality of chips to a donor carrier by means of an adhesive layer of the donor carrier.
FIG. 2c shows a cross sectional view of an intermediate product of the manufacturing of the device after a step of releasing the plurality of chips or the proper subset of the plurality of chips from the handling carrier.
FIG. 2d shows a cross sectional view of an intermediate product of the manufacturing of the device after the step of selectively attaching the second surface of a subset (e.g. proper subset) of the plurality of chips to a conveyor carrier by means of a structured adhesive layer.
FIG. 2e shows a cross sectional view of an intermediate product of the manufacturing of the device after the step of selectively releasing the subset (e.g. proper subset) of the plurality of chips from the donor carrier (or handling carrier)
FIG. 2f shows a cross sectional view of an intermediate product of the manufacturing of the device after the step of attaching the first surface of the subset (e.g. proper subset) of the plurality of chips to a substrate of the device and after the step of releasing the subset (e.g. proper subset) of the plurality of chips from the conveyor carrier.

FIG. 2a shows a cross-sectional view of an intermediate product of the manufacturing of the device after a step of providing a handling carrier 200 having attached thereto a plurality of chips 210 by means of an adhesive layer 202. In other words, FIG. 2a shows chips 210 on a handling carrier 210.

The adhesive layer 202 can be disposed on a surface of the handling carrier 200, wherein the plurality of chips 210 can be attached to the adhesive layer 202.

As indicated in FIG. 2a by way of example, a second surface 212 of the plurality of chips 210 can be attached to the handling carrier 200 by means of the adhesive layer 202. Naturally, in embodiments, also a first surface 214, opposing the second surface 212, of the plurality of chips 210 can be attached the handling carrier 200 by means of the adhesive layer 202.

The first surface 214 of the chips 210 can be pre-processed, e.g., comprising a metallization layer and optionally having a solder disposed thereon, such as an AuSn layer stack (AU=gold, SN=tin). Alternatively, the method 100 can comprise a step of processing the first surface 214 of the chips 210, such as providing the metallization layer on the first surface 214 of the chips 210 and/or providing a solder on the metallization layer. In the latter case, it is advantageous if the second surface 212 of the chips 210 is attached to the handling carrier 200 by means of the adhesive layer 202, alternatively, a donor carrier could be used for flipping the chips 210.

The handling carrier 200 can be, for example, a glass carrier or glass wafer (i.e., a carrier wafer comprising glass or consisting of glass).

As indicated in FIG. 2a by way of example, the plurality of chips can be micro light emitting diodes (µLEDs). Naturally, in embodiments, the plurality of chips also could be semiconductor chips, optical filters, ferromagnets, high-K dielectrics, tilting mirrors, micro lenses, laser diodes, or photodetectors.

FIG. 2b shows a cross sectional view of an intermediate product of the manufacturing of the device after a step of attaching the first surface 214 of the plurality of chips 210 or a proper subset of the plurality of chips 210 to a donor carrier 220 by means of an adhesive layer 222 of the donor carrier 220. In other words, FIG. 2b shows a transfer of the chips 210 to a donor (wafer flipping).

The adhesive layer 222 can be disposed on a surface of the donor carrier 220, wherein the plurality of chips 210 can be attached to the adhesive layer 222.

The donor carrier 220 can be, for example, a glass carrier or glass wafer (i.e., a carrier wafer comprising glass or consisting of glass).

FIG. 2c shows a cross sectional view of an intermediate product of the manufacturing of the device after a step of releasing the plurality of chips 210 or the proper subset of the plurality of chips from the handling carrier 200. In other words, FIG. 2c shows a chip carrier release (e.g., laser debonding).

The plurality of chips 210 or the proper subset of the plurality of chips 210 can be released from the handling carrier 200 by means of debonding at least corresponding sections of the adhesive layer 202 of the handling carrier 200 (e.g., sections of the adhesive layer 202 of the handling carrier 200 to which the plurality of chips 210 or the proper subset of the plurality of chips 210 are attached).

Figure 3:
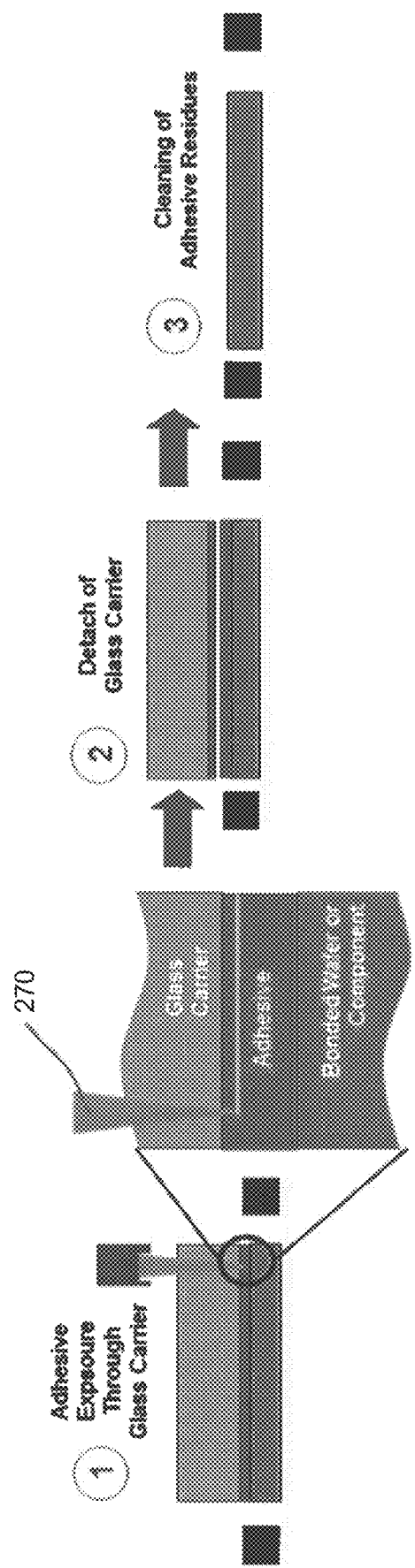
FIG. 3 shows cross sectional views of releasing a bonded wafer or component from a glass carrier by means of laser debonding.

For example, the plurality of chips 210 or the proper subset of the plurality of chips 210 can be released from the handling carrier 200 by means of debonding (e.g., laser debonding) at least corresponding sections of the adhesive layer 202 of the handling carrier 200. When using temporary bonding and laser debonding of glass carriers (e.g., wafers), in a first step (cf. FIG. 3), the adhesive layer can be exposed through the glass carrier by means of a laser 270 (e.g., excimer laser (e.g., 248 nm (KrF) excimer laser)) that scans over the entire carrier surface or at least over corresponding sections of the carrier surface, wherein the laser is focused on the adhesive layer, such that the laser energy causes a material de-composition of the adhesive layer, thereby opening the bond layer (adhesive layer). In a second step, the glass carrier can be detached, and in a third step, adhesive residues can be cleansed.

FIG. 2d shows a cross sectional view of an intermediate product of the manufacturing of the device after the step 104 of selectively attaching the second surface 212 of a subset (e.g. proper subset) of the plurality of chips 210 to a conveyor carrier 230 by means of a structured adhesive layer 232. In other words, FIG. 2d shows a conveyor chip bonding.

The structured adhesive layer 232 can be disposed on a surface of the conveyor carrier 230. The structured adhesive layer 232 can be obtained, for example, by providing the conveyor carrier 230 with an adhesive layer disposed thereon, and structuring the adhesive layer of the conveyor carrier 230 based on a two-dimensional pattern defining the subset (e.g., proper subset) of the plurality of chips 210.

The conveyor carrier 230 can be, for example, a glass carrier or glass wafer (i.e., a carrier wafer comprising glass or consisting of glass).

In FIG. 2d, it is exemplarily assumed that the conveyor carrier 230 is attached to the subset (e.g., proper subset) of the plurality of chips 210 that are attached to the donor carrier 220. Thereby, it is noted that depending on whether the chips 210 have to be processed (e.g., a metallization layer has to be provided on the first surface 212 of the chips and/or a solder has to be provided on the metallization layer) and/or depending on the orientation of chips 210 on the handling carrier 200, the conveyor carrier 230 also can be attached directly to the subset (e.g., proper subset) of plurality of chips 210 that are attached to the handling carrier 200, i.e., in embodiments, the steps of FIGS. 2b and 2c (providing the donor carrier and flipping the chips) can be omitted.

FIG. 2e shows a cross sectional view of an intermediate product of the manufacturing of the device after the step 106 of selectively releasing the subset (e.g. proper subset) of the plurality of chips 210 from the donor carrier 220 (or handling carrier 200).

The subset (e.g. proper subset) of the plurality of chips 210 can be released from the donor carrier 220 (or handling carrier 200) by means of debonding corresponding sections of the adhesive layer of the donor carrier 220 (or handling carrier 200), e.g., sections of the adhesive layer of the donor carrier 220 (or handling carrier 200) to which the subset (e.g., proper subset) of the plurality of chips 210 are attached.

For example, the subset (e.g. proper subset) of the plurality of chips 210 can be released from the donor carrier 220 (or handling carrier 200) by means of laser debonding (cf. FIG. 3) corresponding sections of the adhesive layer of the donor carrier 220 (or handling carrier 200).

Further, the method 100 can comprise a step of cleaning the first surface 214 of the subset of the plurality of chips 210 after releasing the subset (e.g. proper subset) of the plurality of chips 210 from the donor carrier 220 (or handling carrier 200).

FIG. 2*f* shows a cross sectional view of an intermediate product of the manufacturing of the device after the step 108 of attaching the first surface 214 of the subset (e.g. proper subset) of the plurality of chips 210 to a substrate 250 of the device and after the step 110 of releasing the subset (e.g. proper subset) of the plurality of chips 210 from the conveyor carrier 230.

The subset (e.g. proper subset) of the plurality of chips 210 can be released from the conveyor carrier 230 by means of debonding at least corresponding sections of the structured adhesive layer 232 of the conveyor carrier 230 (e.g., sections of the structured adhesive layer 232 of the conveyor layer 230 to which the subset (e.g., proper subset) of the plurality of chips 210 are attached).

For example, the subset (e.g. proper subset) of the plurality of chips 210 can be released from the conveyor carrier 230 by means of laser debonding (cf. FIG. 3) at least corresponding sections of the structured adhesive layer 232 of the conveyor carrier 230.

Figure 4:
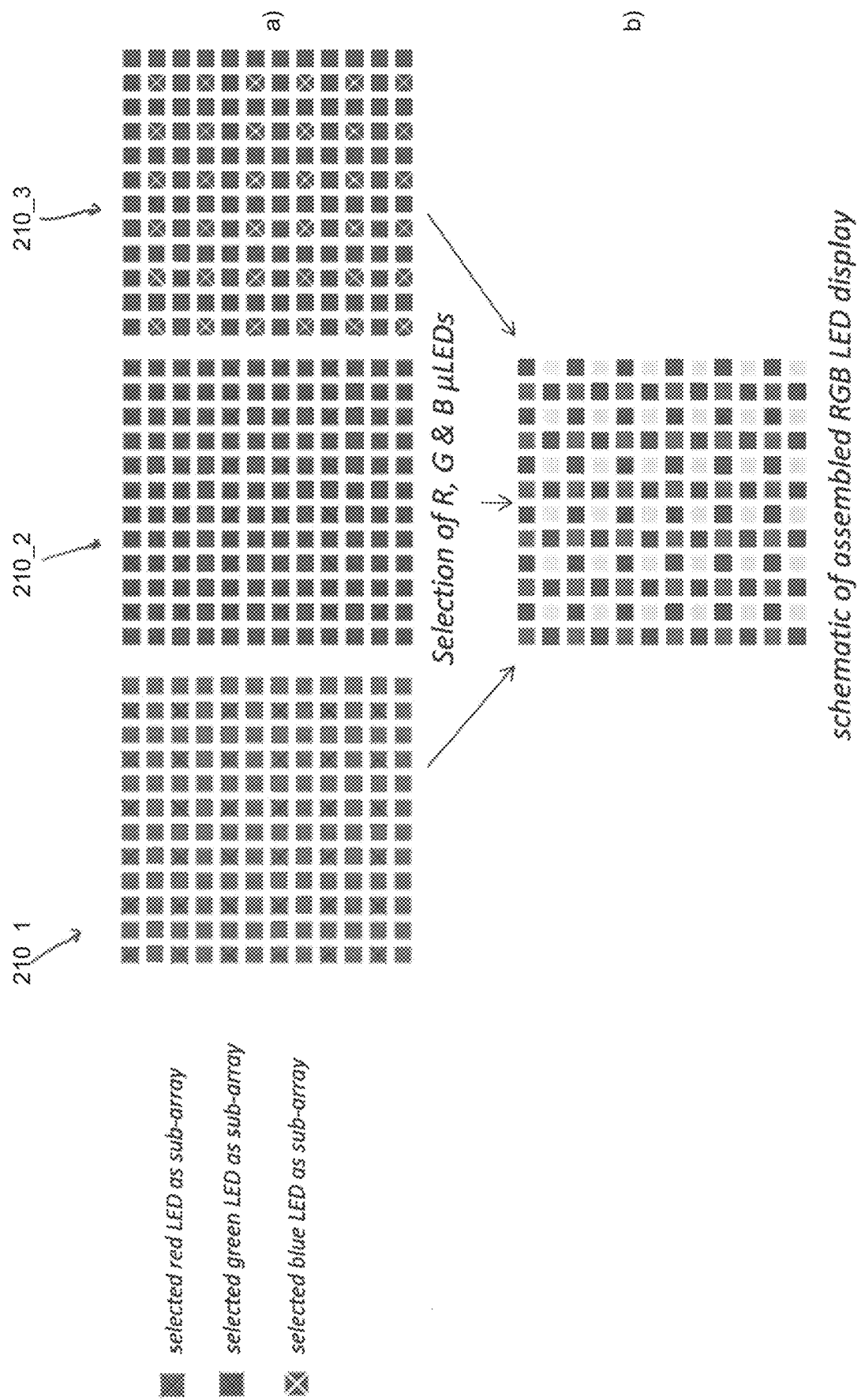
FIG. 4a shows a top view of an intermediate product of the manufacturing of the device after a step of providing three handling carriers (or donor carriers), each handling carrier (or donor carrier) having attached thereto a plurality of chips.
FIG. 4b shows a top view of an intermediate product of the manufacturing of the device after attaching the proper subsets of the first, second and third pluralities of chips to the substrate of the device.

As indicated in FIG. 2*f* by way of example, the method 100 allows to attach different chips (e.g., µLEDs of different colors) to the same substrate 250, by means of sequential attaching (e.g., bonding) the different chips to the substrate 250 of the device and debonding (e.g., laser debonding (laser release)) from the respective conveyor carrier, as described with respect to FIG. 4 in further detail.

FIG. 4*a* shows a top view of an intermediate product of the manufacturing of the device after a step of providing three handling carriers (or donor carriers), each handling carrier (or donor carrier) having attached thereto a plurality of chips. In detail, a first plurality of chips 210_1 can be attached to a first handling carrier (or donor carrier), a second plurality of chips 210_2 can be attached to a second handling carrier (or donor carrier), and a third plurality of chips 210_3 can be attached to a third handling carrier (or donor carrier).

The first plurality of chips 210_1 can be arranged in a two-dimensional array on the first handling carrier (or donor carrier), wherein a proper subset of the first plurality of chips 210_1 that are to be transferred and attached to the substrate 250 of the device can be defined by a two-dimensional pattern. Similarly, the second plurality of chips 210_2 can be arranged in a two-dimensional array on the second handling carrier (or donor carrier), wherein a proper subset of the second plurality of chips 210_2 that are to be transferred and attached to the substrate 250 of the device can be defined by a two-dimensional pattern. The third plurality of chips 210_3 can be arranged in a two-dimensional array on the third handling carrier (or donor carrier), wherein a proper subset of the third plurality of chips 210_3 that are to be transferred and attached to the substrate 250 of the device can be defined by a two-dimensional pattern.

As exemplarily indicated in FIG. 4*a*, according to the respective two-dimensional pattern, at least every 2nd chip in a row direction and/or at least every 2nd chip in a column direction can be selected out of the corresponding two-dimensional array of chips, to obtain the corresponding proper subset of chips.

FIG. 4*b* shows a top view of an intermediate product of the manufacturing of the device after attaching the proper subsets of the first, second and third pluralities of chips 210_1, 210_2, 210_3 to the substrate 250 of the device.

In FIGS. 4*a* and 4*b* it is exemplarily assumed that the first plurality of chips 210_1 are µLEDs of a first color (e.g., red), the second plurality of chips 210_2 are µLEDs of a second color (e.g., green), and the third plurality of chips 210_3 are µLEDs of a third color (e.g., blue). Naturally, in embodiments, the plurality of chips also could be semiconductor chips, optical filters, ferromagnets, high-K dielectrics, tilting mirrors, micro lenses, laser diodes, or photodetectors.

As becomes obvious, embodiments provide a collective picking of a chip (e.g., LED) selection (=proper subset of the corresponding plurality of chips), and a collective transfer and bonding to the substrate 250 of the device. Thereby, no handling of single chip dies is required.

Subsequently, embodiments of the different steps of the method 100 for manufacturing the device are described in further detail.

Figure 5:
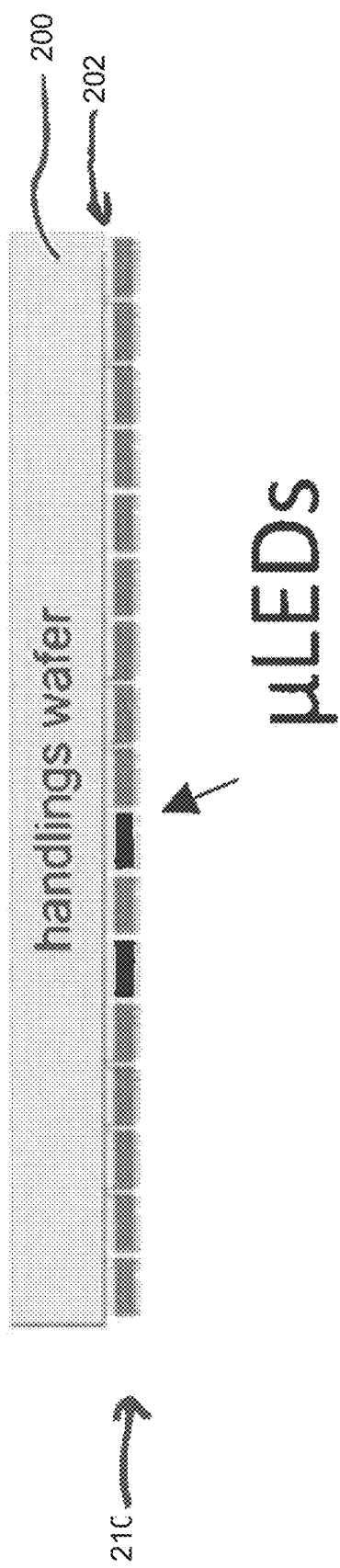
FIG. 5 shows a cross-sectional view of an intermediate product of the manufacturing of the device after a step of providing a handling carrier having attached thereto a plurality of chips by means of an adhesive layer.

FIG. 5 shows a cross-sectional view of an intermediate product of the manufacturing of the device after a step of providing a handling carrier 200 having attached thereto a plurality of chips 210 by means of an adhesive layer 202. In other words, FIG. 5 shows a chip (e.g., LED) wafer with (e.g., AuSn) contacts.

The first surface of the chips 210 can be pre-processed, e.g., comprising a metallization layer and optionally having a solder disposed thereon, such as an AuSn layer stack. Alternatively, the method 100 can comprise a step of processing the first surface 214 of the chips 210, such as providing the metallization layer on the first surface 214 of the chips 210 and/or providing a solder on the metallization layer.

The handling carrier 200 can be, for example, a glass carrier or glass wafer (i.e., a carrier wafer comprising glass or consisting of glass).

In embodiments, the method 100 can comprise a step (e.g., step 1) of providing a chip wafer or chip substrate (e.g., with the plurality of chips), wherein the wafer/substrate can be (temporary) adhered on (or attached to) a handling wafer 200, wherein the wafer/substrate can be diced in the chips to be bonded.

In embodiments, optionally the wafer/substrate can be thinned, e.g., if the target thickness has not been obtained.

In embodiments, optionally, metallizations can be deposited on the wafer/substrate for subsequent bonding, e.g., if metallizations are not yet present.

For example, for soldering with AuSn, an AuSn solder can be used, wherein a solderable metallization can be deposited on the target substrate.

For example, for soldering with AuSn, an Sn solder can be used, wherein Au can be deposited on the target substrate, such that an AuSn solder is formed during bonding.

For example, for soldering with AuSn, a solderable metallization (e.g., Ti/Pt/Au) can be used, wherein AuSn solder can be deposited on the target substrate.

For example, for soldering in general, a solder component can be used, wherein a solderable metallization can be deposited on the target substrate.

For example, for soldering in general, a solderable metallization can be used, wherein a solder component can be deposited on the target substrate.

For example, for pressure welding, Au or nanoporous Au can be used, wherein Au or nanoporous Au can be deposited on the target substrate.

In embodiments, the wafer/substrate can be diced preferably by a dry etching processes, laser dicing or plasma etching.

Preferably, in embodiments, an AuSn solder can be used. For example, AuSn soldering can be performed with a stack of Au and Sn at an eutectic temperature of approx. 280° C. or higher. The layer stack on the (e.g., semiconductor) chips can be adjusted to the eutectic composition with an excess of Au. Soldering initially creates the eutectic composition with the low melting point of 280° C., then the excess of gold shifts the eutectic composition of the compound to a gold-rich composition that solidifies (Transient Liquid Phase Bonding, TLPB), so that the solder connection requires a higher temperature of approx. 510° C. for a long time to melt again. Thus, when the bonding the second subset of the plurality of chips to the substrate of the device, the solder connection of the first bonding process by means of which the first plurality of chips are bonded to the substrate of the device does not melt. When bonding the third plurality of chips to the substrate of the device, the bond connection of the first plurality of chips and of the second plurality of chips no longer melts.

FIG. 6a shows a cross-sectional view of an intermediate product of the manufacturing of the device during a step of attaching the first surface 214 of the plurality of chips 210 or a proper subset of the plurality of chips 210 to a donor carrier 220 by means of an adhesive layer 222 of the donor carrier 220.

FIG. 6b shows a cross sectional view of an intermediate product of the manufacturing of the device after a step of releasing the plurality of chips 210 or the proper subset of the plurality of chips 210 from the handling carrier 200.

FIG. 6c shows a cross-sectional view of an intermediate product of the manufacturing of the device after a step of providing a handling carrier 200 having attached thereto a plurality of chips 210 by means of an adhesive layer 202.

FIG. 6d shows a cross sectional view of an intermediate product of the manufacturing of the device after a step of flipping the plurality of chips 210 or the proper subset of the plurality of chips 210 by means of the donor carrier 220 and removing the handling carrier 200 from the plurality of chips 210 or the proper subset of the plurality of chips 210.

As indicated in FIGS. 6a-6d, the donor carrier 220 (e.g., donor wafer (glass)) can be used for flipping the plurality of chips 210 or the proper subset of the plurality of chips 210, i.e. chips frontside down.

In embodiments, the method 100 optionally can comprise a step (e.g., step 2) of re-bonding the wafer/substrate to a second carrier (=donor carrier) 220 with an adhesive layer 222.

Thereby, in embodiments, for subsequently offering the desired front and rear of the chips, the handling carrier can become the donor carrier without re-bonding.

Further, in embodiments, optionally, the adhesive layer can be structured into adhesive figures, wherein the adhesive figures can be significantly smaller than the chip dimensions and several adhesive figures can be allocated to one chip (cf. DE 10 2014 201 635 B3).

Further, in embodiments, optionally, the carrier (donor) carrier can diced with the diced chips arranged thereon into donor tiles.

Figure 7:
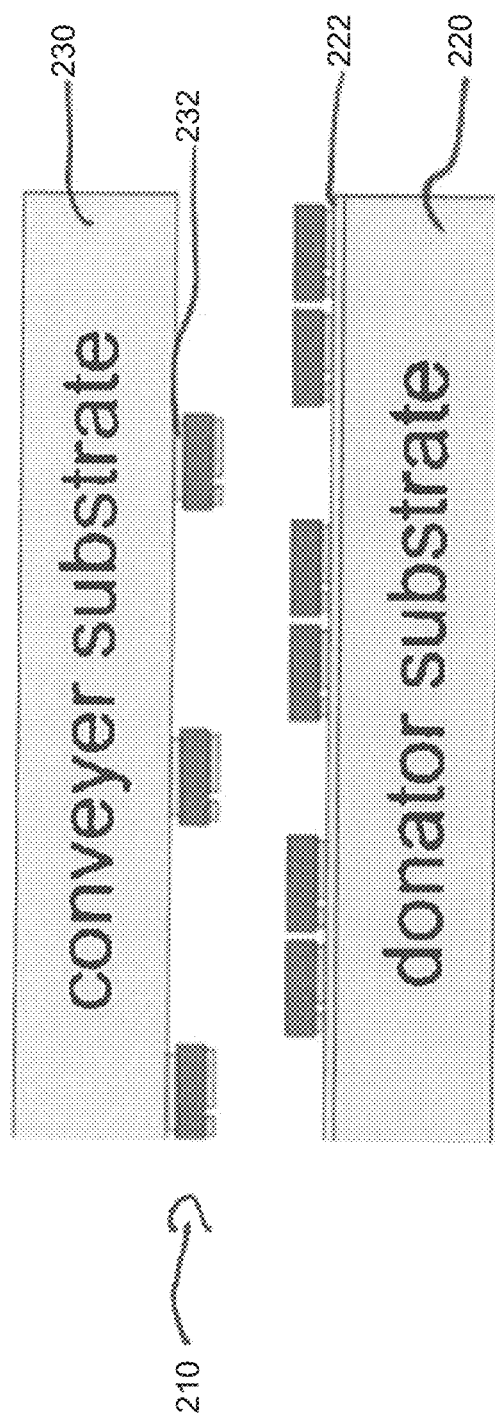
FIG. 7 shows a cross sectional view of an intermediate product of the manufacturing of the device after the steps of selectively attaching a subset (e.g. proper subset) of the plurality of chips to a conveyor carrier and selectively releasing a proper subset of the plurality of chips from the donor carrier (or handling carrier)

FIG. 7 shows a cross sectional view of an intermediate product of the manufacturing of the device after the steps of selectively attaching a subset (e.g. proper subset) of the plurality of chips 210 to a conveyor carrier 230 and selectively releasing a proper subset of the plurality of chips 210 from the donor carrier 220 (or handling carrier 200).

As indicated in FIG. 7, in embodiments, the method 100 can comprise a step (e.g., step 3) of providing transfer tiles. In detail, a conveyor carrier 230 (e.g., transfer wafer (substrate)) can be provided with a structured assembly of (temporary) adhesive joints 232.

For example, for each chip to be transferred, at least one adhesive joint can be provided.

For example, adhesive joints can be lithographically structured on the conveyor carrier 230 (e.g., transfer wafer/substrate).

For example, adhesive joints can be structured by stamping or printing the adhesive.

For example, the conveyor carrier 230 (e.g., transfer wafer/substrate) can be diced into transfer tiles.

Figure 8A:
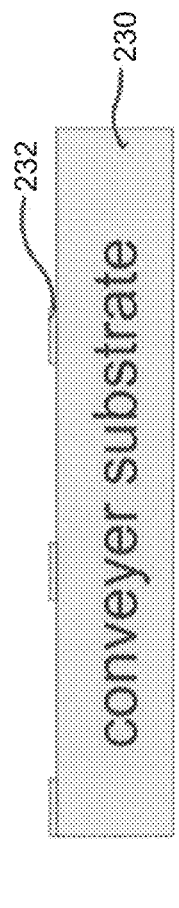
FIG. 8a shows a cross sectional view of an intermediate product of the manufacturing of the device after a step of providing a conveyor carrier having disposed thereon a structured adhesive layer.

FIG. 8a shows a cross sectional view of an intermediate product of the manufacturing of the device after a step of providing a conveyor carrier 230 having disposed thereon a structured adhesive layer 232. In other words, FIG. 8a shows a glass substrate 230 with structured adhesive layer 232, coupon level (glass chip).

Figure 8B:
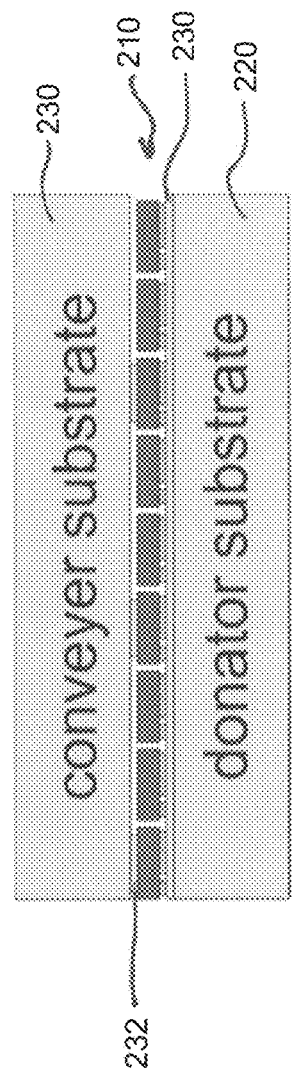
FIG. 8b shows a cross sectional view of an intermediate product of the manufacturing of the device after a step of selectively attaching a subset (e.g. proper subset) of the plurality of chips to a conveyor carrier by means of the structured adhesive layer.

FIG. 8b shows a cross sectional view of an intermediate product of the manufacturing of the device after a step of selectively attaching a subset (e.g. proper subset) of the plurality of chips 210 to a conveyor carrier 230 by means of the structured adhesive layer 232. In other words, FIG. 8b shows a bonding of conveyor substrate 230 to donor substrate 220 using a precise alignment. For example, the alignment can be performed at conveyor bonding temperature.

Figure 8C:
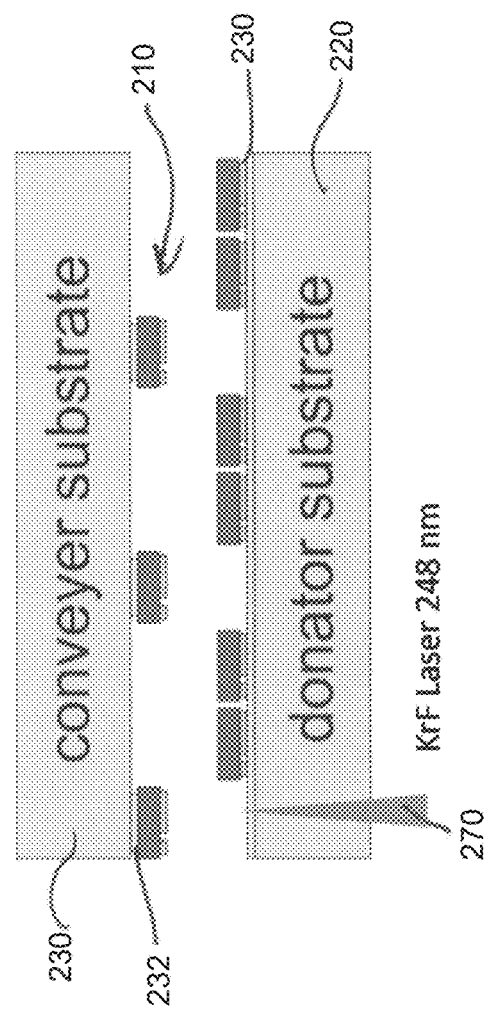
FIG. 8c shows a cross sectional view of an intermediate product of the manufacturing of the device after the step of selectively releasing the subset (e.g. proper subset) of the plurality of chips from the donor carrier (or handling carrier) by means of laser debonding.

FIG. 8c shows a cross sectional view of an intermediate product of the manufacturing of the device after the step 106 of selectively releasing the subset (e.g. proper subset) of the plurality of chips 210 from the donor carrier 220 (or handling carrier 200) by means of laser 270 debonding. In other words, FIG. 8c shows a laser release of the conveyor 230 and a transfer of chips (e.g., LEDs) defined by the design of the adhesive 232 of the conveyor substrate 230. Thereby, pitch adjustment can be performed for each type of chip (e.g., color).

As shown in FIGS. 8a-8c, in embodiments, the method 100 can comprise a step (e.g., step 4) of transferring the chips 210 (e.g., a subset (e.g., proper subset) of the plurality of chips 210) from the donor carrier 220 (e.g., donor wafer/substrate) or from the donor tile to the conveyor carrier 230 or transfer tile.

For example, the adhesive joints 232 of the transfer tiles can be aligned to the chips 210 on the donor carrier 220 (e.g., donor wafer/substrate) or the donor tile.

For example, the transfer tile can be bonded by means of pressure and temperature.

For example, the chips can be de-bonded from the donor wafer/substrate or from the donor tile. For instance, de-bonding can be performed by means of a laser beam through the rear of the donor carrier 220 (e.g., donor wafer/substrate) or the donor tile. For this, the same has to be transparent for the wavelength of the laser, wherein the laser reduces the adhesive strength of the adhesive layer 222. Alternatively, de-bonding can be performed by means of force application for mechanical separation. For this, the adhesive layer 222 on the donor carrier 220 can be structured in small adhesive figures (cf. DE 10 2014 201 635 B3).

For example, after de-bonding the chips 210, same can cleansed from adhesive residues.

Figure 9:
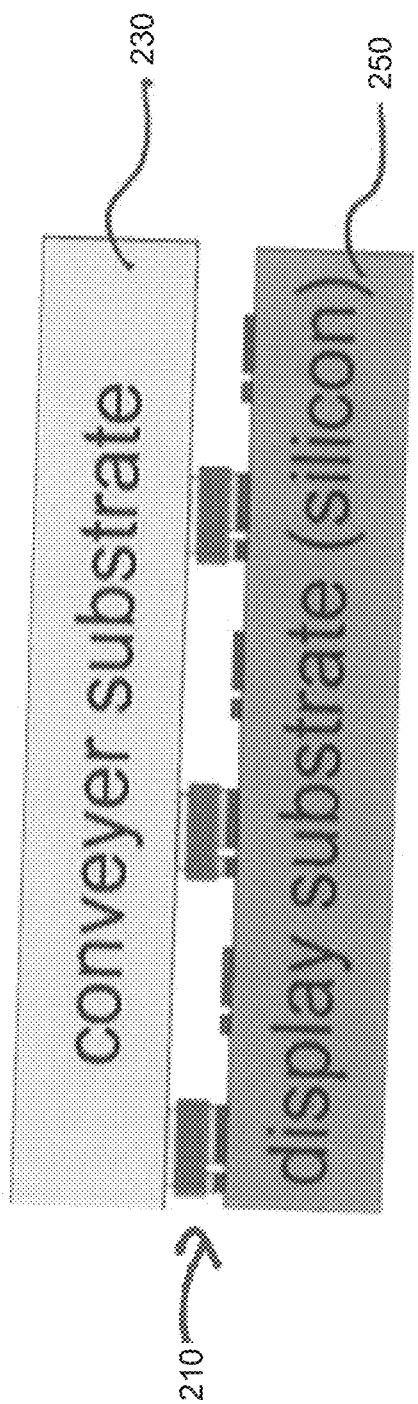
FIG. 9 shows a cross sectional view of an intermediate product of the manufacturing of the device after the step of attaching the subset (e.g. proper subset) of the plurality of chips to the substrate of the device.

FIG. 9 shows a cross sectional view of an intermediate product of the manufacturing of the device after the step 108 of attaching the subset (e.g. proper subset) of the plurality of chips 210 to the substrate 250 of the device. In other words, FIG. 9 shows a device (e.g., display) substrate wafer/die (e.g., silicon), wherein selected chips (=subset (e.g. proper subset) of the plurality of chips 210) are soldered to the substrate 250 (e.g., sequentially (e.g., 1× first type chip (e.g., red LED), 1× second type chip (e.g., green LED), 1× third type of chip (e.g., blue LED)). The wafer (e.g., of the plurality of chips 210) can comprise, for example, Au contacts and lines.

FIG. 10a shows a cross sectional view of an intermediate product of the manufacturing of the device after the step 104 of selectively attaching a subset (e.g. proper subset) of the plurality of chips 210 to a conveyor carrier 230 by means of a structured adhesive layer 232. In other words, FIG. 10a shows a conveyor 230 bonding on chips (e.g., μLEDs) of donor 220.

FIG. 10b shows a cross sectional view of an intermediate product of the manufacturing of the device during the step 106 of selectively releasing the subset (e.g. proper subset) of the plurality of chips 210 from the donor carrier 220 (or handling carrier 200) by means of laser debonding. In other words, FIG. 10b shows (e.g., KrF) laser debonding of donor carrier 220.

FIG. 10c shows a cross sectional view of an intermediate product of the manufacturing of the device after the step 106 of selectively releasing the subset (e.g. proper subset) of the plurality of chips 210 from the donor carrier 220 (or handling carrier 200) and cleansing the subset (e.g. proper subset) of the plurality of chips 210 by means of a plasma.

FIG. 10d shows a cross sectional view of an intermediate product of the manufacturing of the device after cleansing the subset (e.g. proper subset) of the plurality of chips 210 that are attached to the conveyor carrier 230 by means of a plasma.

As indicated in FIGS. 10a-10c, in embodiments, the method 100 can comprise a step (e.g. step 5) of transferring the chips 210 from the conveyor carrier 230 (e.g., transfer tile) to a target substrate 250 and removing the conveyor carrier 230 (e.g., transfer tile).

For example, the target substrate 250 can comprise bondable terminal contact, solder or solder components or Au or nanoporous Au for pressure welding.

For example, the conveyor carrier 230 (e.g., transfer tile) can be aligned with the chips to the terminal contacts of the target substrate 250.

For example, the conveyor carrier 230 (e.g., transfer tile) can be bonded with individual chips, e.g., by means of placing same on the target substrate and remelting the solder without contact pressure (reflow soldering), or by means of pressure and temperature for soldering or pressure welding.

For example, the conveyor carrier 230 (e.g., transfer tile) can be de-bonded from the chips that are bonded to the target substrate 250. Thereby, de-bonding can be performed by means of a laser beam through the rear of the donor carrier 220 (e.g., donor wafer/substrate) or the donor tile. For this, the same can be transparent for the wavelength of the laser. The laser reduces the adhesive strength of the adhesive layer. Alternatively, de-bonding can be performed by means of force application for mechanical separation. For this, the adhesive layer on the donor side can be structured in small adhesive figures (cf. DE 10 2014 201 635 B3).

For example, after de-bonding, optionally the chips 210 can be cleansed from adhesive residues.

In embodiments, transfer bonding with above described steps 1 to 5 can be repeated for bonding chips of different wafer/substrate sources onto the same target substrate, as will become clear from the following discussion of FIGS. 11a-11f.

FIG. 11a shows a cross sectional view of an intermediate product of the manufacturing of the device after the step 108 of attaching a subset (e.g. proper subset) of the first plurality of chips 210_1 (e.g., μLEDs of a first color (e.g., red)) to the substrate 250 of the device using a first conveyor carrier 230_1. In other words, FIG. 11a shows a bonding of the first conveyor 230_1 (e.g., R-conveyor (i.e., with R (=red) μLEDs)).

FIG. 11b shows a cross sectional view of an intermediate product of the manufacturing of the device during the step 110 of releasing the subset (e.g. proper subset) of the first plurality of chips 210_1 from the first conveyor carrier 230_1, e.g. by means of laser 270 debonding. In other words, FIG. 11b shows a laser debonding of the first conveyor 230_1 (e.g., R-conveyor).

FIG. 11c shows a cross sectional view of an intermediate product of the manufacturing of the device after the step 108 of attaching a subset (e.g. proper subset) of a second plurality of chips 210_2 (e.g., μLEDs of a second color (e.g., green)) to the substrate 250 of the device using a second conveyor carrier 230_2. In other words, FIG. 11c shows a bonding of the second conveyor 230_2 (e.g., G-conveyor (i.e., with G (=green) μLEDs)).

FIG. 11d shows a cross sectional view of an intermediate product of the manufacturing of the device during the step 110 of releasing the subset (e.g. proper subset) of the second plurality of chips 210_2 from the second conveyor carrier 230_2, e.g., by means of laser 270 debonding. In other words, FIG. 11d shows a laser debonding of the second conveyor 230_2 (e.g., G-conveyor).

FIG. 11e shows a cross sectional view of an intermediate product of the manufacturing of the device after the step 108 of attaching a subset (e.g. proper subset) of a third plurality of chips 210_3 (e.g., μLEDs of a third color (e.g., blue)) to the substrate 250 of the device using a third conveyor carrier 230_3. In other words, FIG. 112 shows a bonding of the third conveyor 230_3 (e.g., B-conveyor (i.e., with B (=blue) μLEDs)).

FIG. 11f shows a cross sectional view of an intermediate product of the manufacturing of the device during the step 110 of releasing the subset (e.g. proper subset) of the third plurality of chips 210_3 from the third conveyor carrier 230_3, e.g., by means of laser 270 debonding. In other words, FIG. 11f shows a laser debonding of the third conveyor 230_3 (e.g., B-conveyor).

In embodiments, chips can be LEDs, in particular, mini-LEDs or micro-LEDs (below 100 μm edge length). Target substrate 250 can be a display or part of a display (e.g., a glass substrate or a flexible circuit carrier) or a semiconductor chip for active control of the LEDs. Also, several LED chips or wafers having different wavelengths red, green and blue, can be bonded offset to one another in order to generate RGB cells and to form a color display.

In embodiments, chips can be VCSEL (=vertical-cavity surface-emitting laser) that are arranged in one- or two-dimensional arrays on a circuit carrier. Here, different wavelengths can be arranged side by side in order to transmit signals in parallel in the same waveguide or in the same optical fiber and in that way to increase the bandwidth.

Embodiments provide the advantage that no specifically designed components (e.g., without removable/breakable holding rod) and no expensive tools are required. Rather, standard equipment, such as lithography and micro galvanics, wafer bonder, flip chip bonder, laser for de-bonding, and plasma cleaning can be used.

Embodiments provide the advantage that AuSn solder is extremely solid compared to adhesive processes or conventional soldering AuSn compounds, such as a low thermal resistance for good cooling, corrosion-proof, electromigration-resistant and a high melting point.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A method for manufacturing a device, the method comprising:
   providing a first carrier having attached thereto a plurality of chips by way of an adhesive layer disposed on the first carrier, wherein a first surface of the plurality of chips is attached to the first carrier;
   selectively attaching a second surface of a subset of the plurality of chips to a conveyor carrier by way of a structured adhesive layer disposed on the conveyor layer;
   selectively releasing the subset of the plurality of chips from the first carrier by way of debonding at corresponding sections of the adhesive layer of the first carrier to which the subset of the plurality of chips are attached;
   attaching the first surface of the subset of the plurality of chips to a substrate of the device; and
   releasing the subset of the plurality of chips from the conveyor carrier by way of debonding corresponding sections of the structured adhesive layer of the conveyor carrier to which the subset of the plurality of chips are attached,
      wherein at least one of selectively releasing the subset of the plurality of chips from the first carrier and releasing the subset of the plurality of chips from the conveyor carrier is performed by way of laser debonding, and wherein the first carrier and the conveyor carrier are glass carriers.

2. The method according to claim 1, wherein the plurality of chips is a two-dimensional array of chips.

3. The method according to claim 1, wherein the subset of the plurality of chips is defined by a two-dimensional pattern.

4. The method according to claim 3, wherein according to the two-dimensional pattern, at least every second or third chip in a row direction and/or at least every second or third chip in a column direction is selected from the two-dimensional array of chips, to obtain the subset of chips.

5. The method according to claim 3 further comprising:
providing the conveyor carrier with an adhesive layer disposed thereon; and
structuring the adhesive layer of the conveyor carrier based on the two-dimensional pattern defining the subset of the chips, to obtain the structured adhesive laser of the conveyor layer.

6. The method according to claim 1, wherein attaching the first surface of the subset of the plurality of chips to the substrate of the device comprises bonding the subset of the plurality of chips to the substrate of the device.

7. The method according to claim 1, wherein the first surface of plurality of chips comprises a metallization layer.

8. The method according to claim 1, wherein the first surface of the subset of the plurality of chips comprises a metallization layer having disposed thereon an AuSn solder layer stack,
wherein attaching the first surface of the subset of the plurality of chips to the substrate of the device comprises soldering the subset of the plurality of chips to the substrate of the device at a temperature of at least 280° C.

9. The method according to claim 1, wherein the first carrier is a handling carrier.

10. The method according to claim 1, wherein the first carrier is a donor carrier, and wherein providing the first carrier comprises:
providing a handling carrier having attached thereto the plurality of chips by way of an adhesive layer of the handling carrier, the second surface of the plurality of chips being attached to the handling carrier;
attaching the first surface of the plurality of chips or a subset of the plurality of chips to the donor carrier by way of the adhesive layer of the donor carrier; and
releasing the plurality of chips or the subset of the plurality of chips from the handling carrier by way of laser debonding at least corresponding sections of the adhesive layer of the handling carrier.

11. The method according to claim 10, wherein providing the first carrier that is the donor carrier further comprises:
providing a metallization layer on the first surface of the devices prior to attaching the first surface of the plurality of chips to the donor carrier; or
providing a metallization layer on the first surface of the devices prior to attaching the first surface of the plurality of chips to the donor carrier and providing an AuSn solder layer stack on the metallization layer.

12. The method according to claim 9, wherein providing the first carrier which is the handling carrier comprises:
providing a substrate having formed thereon the plurality of chips;
attaching the substrate with the plurality of chips to the handling carrier by way of an adhesive layer, the plurality of chips facing the carrier; and
separating the plurality of chips from the substrate.

13. The method according to claim 1, wherein the plurality of chips are a first plurality of chips, and wherein the method further comprises:
providing a second carrier having attached thereto a second plurality of chips by way of an adhesive layer of the second carrier, a first surface of the second plurality of chips being attached to the second carrier;
selectively attaching a second surface of a subset of the second plurality of chips to a second conveyor carrier by way of a structured adhesive layer of the second conveyor layer;
selectively releasing the subset of the second plurality of chips from the second carrier by way of laser debonding corresponding sections of the adhesive layer of the second carrier;
attaching the first surface of the subset of the second plurality of chips to the substrate of the device; and
releasing the subset of the second plurality of chips from the second conveyor carrier by way of laser debonding at least corresponding sections of the structured adhesive layer of the second conveyor carrier.

14. The method according to claim 13, wherein the subset of the first plurality of chips and the subset of the second plurality of chips are arranged in an interleaved manner with respect to each other on the substrate of the device.

15. The method according to claim 13, wherein the first surface of the subset of the first plurality of chips and the first surface of the subset of the second plurality of chips comprises a metallization layer having disposed thereon an AuSn solder layer stack,
wherein attaching the first surface of the subset of the first plurality of chips to the substrate of the device comprises soldering the first subset of the first plurality of chips to the substrate of the device at a temperature between 280° C. and 350° C.;
wherein attaching the first surface of the subset of the second plurality of chips to the substrate of the device comprises soldering the subset of the second plurality of chips to the substrate of the device at a temperature between 280° C. and 350° C.; and
wherein the first plurality of chips are soldered to the substrate of the device prior to attaching the first surface of the subset of the second plurality of chips to the substrate of the device.

16. The method according to claim 1, wherein the plurality of chips are at least one of semiconductor chips, optical filters, ferromagnets, high-K dielectrics, tilting mirrors, micro lenses, laser diodes, photodetectors and light emitting diodes.

17. The method according to claim 1, wherein the device is a display or a part of a display, or wherein the device is an optical module or part of an optical module, or wherein the device is a power regulator or switches.

18. The method according to claim 1, including:
attaching a first surface of a subset of a second plurality of chips to the substrate of the device by soldering the subset of the second plurality of chips to the substrate of the device at a temperature between 280° C. and 350° C.,
wherein the first surface of the subset of the first plurality of chips and a first surface of the subset of the second plurality of chips comprise a metallization layer having disposed thereon an AuSn solder layer stack,
wherein attaching the first surface of the subset of the first plurality of chips to the substrate of the device comprises soldering the subset of the first plurality of chips to the substrate of the device at a temperature between 280° C. and 350° C., and wherein the first plurality of chips is soldered to the substrate of the device prior to attaching the first surface of the subset of the second plurality of chips to the substrate of the device.

19. A method for manufacturing a device, the method comprising:
providing a first carrier having attached thereto a first plurality of chips by way of an adhesive layer disposed on the first carrier, wherein a first surface of the first plurality of chips being attached to the first carrier;
providing a second carrier having attached thereto a second plurality of chips by way of an adhesive layer disposed on the second carrier, wherein a first surface of the second plurality of chips being attached to the second carrier;
selectively attaching a second surface of a subset of the first plurality of chips to a first conveyor carrier by way of a structured adhesive layer disposed on the first conveyor layer;
selectively attaching a second surface of a subset of the second plurality of chips to a second conveyor carrier by way of a structured adhesive layer on the second conveyor layer;
selectively releasing the subset of the first plurality of chips from the first carrier by way of laser debonding corresponding sections of the adhesive layer of the first carrier;
selectively releasing the subset of the second plurality of chips from the second carrier by way of laser debonding corresponding sections of the adhesive layer of the second carrier;
attaching the first surface of the subset of the first plurality of chips to a substrate of the device;
attaching the first surface of the subset of the second plurality of chips to the substrate of the device;
releasing the subset of the first plurality of chips from the first conveyor carrier by way of laser debonding corresponding sections of the structured adhesive layer of the first conveyor carrier to which the proper subset of the plurality of chips are attached; and
releasing the subset of the second plurality of chips from the second conveyor carrier by way of laser debonding corresponding sections of the structured adhesive layer of the second conveyor carrier,
wherein the first surface of the subset of the first plurality of chips and the first surface of the subset of the second plurality of chips comprise a metallization layer having disposed thereon an AuSn solder layer stack,
wherein attaching the first surface of the subset of the first plurality of chips to the substrate of the device comprises soldering the first subset of the first plurality of chips to the substrate of the device at a temperature between 280° C. and 350° C.,
wherein attaching the first surface of the subset of the second plurality of chips to the substrate of the device comprises soldering the subset of the second plurality of chips to the substrate of the device at a temperature between 280° C. and 350° C., and
wherein the first plurality of chips is soldered to the substrate of the device prior to attaching the first surface of the subset of the second plurality of chips to the substrate of the device.

20. The method according to claim 19, wherein the first and second carriers and the first and second conveyor carrier are glass carriers.

* * * * *

UNITED STATES PATENT AND TRADEMARK OFFICE
CERTIFICATE OF CORRECTION

PATENT NO. : 12,327,751 B2
APPLICATION NO. : 17/842430
DATED : June 10, 2025
INVENTOR(S) : Oppermann et al.

Page 1 of 1

It is certified that error appears in the above-identified patent and that said Letters Patent is hereby corrected as shown below:

In the Claims

Claim 15: Column 18, Line 33: "prises soldering the first subset of the first plurality of" should read as -- prises soldering the subset of the first plurality of --.

Signed and Sealed this
Eleventh Day of November, 2025

John A. Squires
*Director of the United States Patent and Trademark Office*